United States Patent
Wiesmann et al.

(10) Patent No.: US 10,263,219 B2
(45) Date of Patent: Apr. 16, 2019

(54) RADIATION-EMITTING COMPONENT WITH ORGANIC LAYER STACK

(71) Applicant: OSRAM OLED GmbH, Regensburg (DE)

(72) Inventors: Christopher Wiesmann, Barbing (DE); Thomas Wehlus, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/917,048

(22) PCT Filed: Aug. 28, 2014

(86) PCT No.: PCT/EP2014/006823
§ 371 (c)(1),
(2) Date: Mar. 7, 2016

(87) PCT Pub. No.: WO2015/036253
PCT Pub. Date: Mar. 19, 2015

(65) Prior Publication Data
US 2016/0204386 A1    Jul. 14, 2016

(30) Foreign Application Priority Data
Sep. 12, 2013 (DE) .................. 10 2013 110 024

(51) Int. Cl.
*H01L 51/52* (2006.01)

(52) U.S. Cl.
CPC ...... *H01L 51/5275* (2013.01); *H01L 51/5268* (2013.01); *H01L 51/5271* (2013.01); *H01L 2251/558* (2013.01)

(58) Field of Classification Search
CPC .......... H01L 2251/558; H01L 51/5268; H01L 51/5271; H01L 51/5275
(Continued)

(56) References Cited

U.S. PATENT DOCUMENTS 6,587,620 B2 *   7/2003   Koyama ............... B82Y 20/00
                                                     257/79
6,704,335 B1 *   3/2004   Koyama ............... H01S 3/0635
                                                     257/43
(Continued)

FOREIGN PATENT DOCUMENTS

DE           60301466 T2    6/2006
DE         102007058453 A1  3/2009
(Continued)

OTHER PUBLICATIONS

Xi, J., et al., "Optical thin-film materials with low refractive index for broadband elimination of Fresnel reflection", Nature Photonics, Mar. 1, 2007, vol. 1, pp. 176-179.
(Continued)

*Primary Examiner* — Mohammed Shamsuzzaman
(74) *Attorney, Agent, or Firm* — Slater Matsil, LLP

(57) ABSTRACT

A radiation-emitting component is disclosed. Embodiments of the invention relate to a radiation-emitting component with an organic layer stack which is arranged on a substrate. An outcoupling structure is arranged on a substrate face facing the organic layer stack, an additional optical layer is arranged between the substrate and the outcoupling structure, and the additional optical structure has a refractive index which is lower than the refractive index of the substrate, or the additional optical layer forms a mirror which has a selective angle and which only allows light that can be coupled out of the substrate at a substrate boundary surface facing away from the organic layer sequence to pass, the light being generated in the organic layer stack during operation.

9 Claims, 3 Drawing Sheets

(58) Field of Classification Search
USPC .............. 257/40, 88, 98; 385/37; 372/43.01
See application file for complete search history.

(56) References Cited

U.S. PATENT DOCUMENTS

| | | | |
|---|---|---|---|
| 6,965,197 | B2 | 11/2005 | Tyan et al. |
| 8,253,155 | B2 | 8/2012 | Krummacher et al. |
| 9,091,415 | B2 | 7/2015 | Bessho et al. |
| 2002/0018620 | A1* | 2/2002 | Koyama ............. B82Y 20/00 385/37 |
| 2003/0071567 | A1 | 4/2003 | Eida et al. |
| 2003/0169386 | A1* | 9/2003 | Goto ..................... G02B 5/08 349/65 |
| 2006/0102912 | A1 | 5/2006 | Abe et al. |
| 2011/0101855 | A1 | 5/2011 | Mizuno |
| 2011/0147777 | A1* | 6/2011 | Konno ............... H01L 51/5275 257/98 |
| 2013/0082244 | A1 | 4/2013 | Heller et al. |
| 2014/0225086 | A1 | 8/2014 | Dobbertin et al. |
| 2014/0319482 | A1* | 10/2014 | Dobbertin ......... H01L 51/5262 257/40 |
| 2015/0053951 | A1 | 2/2015 | Riegel et al. |

FOREIGN PATENT DOCUMENTS

| | | | |
|---|---|---|---|
| DE | 102011079004 | A1 | 1/2013 |
| DE | 102012204934 | A1 | 10/2013 |
| EP | 1309017 | A2 | 5/2003 |
| JP | WO 2013038971 | A1 * | 3/2013 ......... H01L 51/5271 |
| JP | WO 2013065649 | A1 * | 5/2013 ......... H01L 51/5268 |
| WO | 2006091614 | A1 | 8/2006 |
| WO | 2010016763 | A1 | 2/2010 |
| WO | 2013038971 | A1 | 3/2013 |
| WO | 2013039072 | A1 | 3/2013 |
| WO | 2013065649 | A1 | 5/2013 |

OTHER PUBLICATIONS

Nakamura, N., et al., "Glass Substrates for OLED Lighting with High Out-Coupling Efficiency", SID Symposium Digest of Technical Papers, vol. 40, Issue 1, Jun. 2009, pp. 603-606.

Sun, Y., et al., "Enhanced light out-coupling of organic light-emitting devices using embedded low-index grids", Nature Photonics, vol. 2, Aug. 2008, pp. 483-487.

* cited by examiner

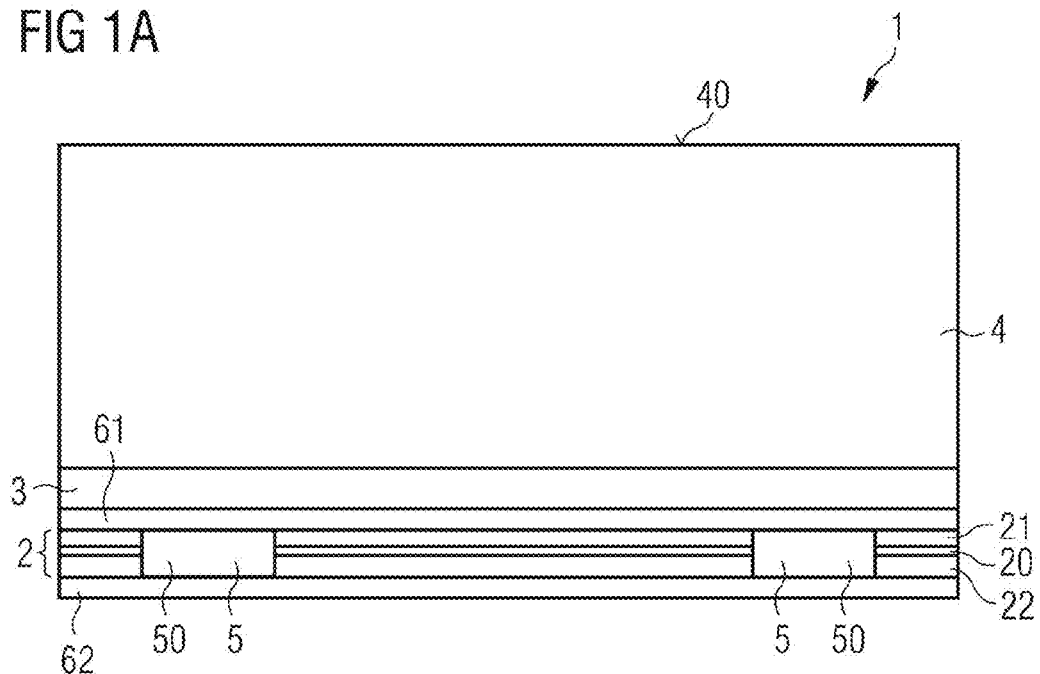
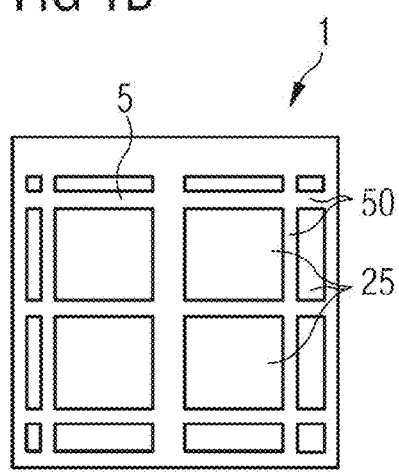

RADIATION-EMITTING COMPONENT WITH ORGANIC LAYER STACK

This patent application is a national phase filing under section 371 of PCT/EP2014/068263, filed Aug. 28, 2014, which claims the priority of German patent application 10 2013 110 024.4, filed Sep. 12, 2013, each of which is incorporated herein by reference in its entirety.

TECHNICAL FIELD

The present application relates to a radiation-emitting component comprising an organic layer stack.

BACKGROUND

The efficiency of organic radiation-emitting components such as OLEDs, for example, is often limited by the coupling-out efficiency of the generated radiation.

SUMMARY

Embodiments of the invention specify a radiation-emitting component which is distinguished by a high coupling-out efficiency and at the same time is producible in a simple manner.

In accordance with at least one embodiment of the radiation-emitting component, the component comprises an organic layer stack. The organic layer stack comprises, in particular, an active region provided for generating radiation. By way of example, the active region is arranged between a first transport layer of a first charge type and a second transport layer of a second charge type, which is different than the first charge type. By way of example, the first transport layer is an electron transport layer and the second transport layer is a hole transport layer, or vice versa.

By way of example, the active region contains organic polymers, organic oligomers, organic monomers, organic small, non-polymeric molecules ("small molecules") or combinations thereof.

In accordance with at least one embodiment of the radiation-emitting component, the component comprises a substrate, on which the organic layer stack is arranged. The substrate mechanically supports the organic layer stack and can be embodied in a rigid or flexible fashion. An interface of the substrate facing away from the organic layer stack is embodied, for example, as a radiation exit surface of the radiation-emitting component. The substrate is transparent or at least translucent for example to the radiation generated in the active region.

In accordance with at least one embodiment of the radiation-emitting component, the component comprises a first electrode layer. The first electrode layer is formed in particular on a side of the organic layer stack facing the substrate. Expediently, the component comprises a second electrode layer on that side of the organic layer stack which faces away from the first electrode layer. During the operation of the radiation-emitting component, via the first electrode layer and the second electrode layer electrons and holes can be injected from different sides into the active region and recombine there with emission of radiation.

In accordance with at least one embodiment of the radiation-emitting component, the component comprises a coupling-out structure. The coupling-out structure is arranged in particular on a side of the substrate facing the organic layer stack. The coupling-out structure is provided for deflecting radiation generated in the organic layer stack, in particular in the active region, for example on the basis of scattering and/or diffraction.

In accordance with at least one embodiment of the radiation-emitting component, the radiation-emitting component comprises an optical supplementary layer. The optical supplementary layer is arranged in particular between the substrate and the coupling-out structure. The optical supplementary layer is provided, in particular in addition to the coupling-out structure, for increasing the radiation coupling-out efficiency for radiation generated in the radiation-emitting component during operation.

In accordance with at least one embodiment of the radiation-emitting component, the optical supplementary layer has a refractive index that is less than the refractive index of the substrate. Furthermore, the refractive index of the optical supplementary layer is less than the refractive index of the organic layer stack.

The lower the refractive index of the optical supplementary layer, the greater that proportion of radiation which is reflected back at the optical supplementary layer on account of total internal reflection in the direction of the organic layer stack. This proportion of radiation can be deflected at the coupling-out structure and can subsequently impinge on the optical supplementary layer again at least partly at a smaller angle with respect to the normal to the organic layer stack. The proportion of radiation passing through the optical supplementary layer overall thus has a reduced proportion of radiation impinging at a large angle in favor of an increased proportion of radiation which passes at a small angle with respect to the normal.

In case of doubt, small angles are considered to be, in particular, angles which are less than the critical angle of total internal reflection at the interface of the substrate facing away from the organic layer sequence. Large angles are correspondingly angles which are greater than or equal to the critical angle of total internal reflection at the interface.

Radiation passing at the small angle with respect to the normal in the substrate is therefore at least partly coupled out from the substrate. The coupling-out efficiency of the radiation-emitting component is increased overall by the reduced proportion of radiation which impinges on the interface at large angles and would be subjected to total internal reflection there.

In accordance with at least one embodiment of the radiation-emitting component, the optical supplementary layer forms an angle-selective mirror that allows passage only of such light which is generated in the organic layer stack during operation and which can be coupled out from the substrate at the interface of the substrate facing away from the organic layer sequence. That means, in particular, that the angle-dependent reflectivity of the optical supplementary layer for radiation which would be coupled into the substrate at a coupling-in angle at which the radiation can no longer be coupled out at the interface is at least 50%. Preferably, the reflectivity for this proportion of radiation averaged is at least 80%.

In other words, the optical supplementary layer is embodied such that radiation which would be subjected to total internal reflection at the interface of the substrate and consequently could not emerge from the substrate is already reflected at the angle-selective mirror. Consequently, this proportion of radiation can be deflected by the coupling-out structure and subsequently impinge on the optical supplementary layer at a small angle with respect to the normal and can be coupled out after passage through the substrate at the interface.

In at least one embodiment of the radiation-emitting component, the component comprises an organic layer stack arranged on a substrate. A coupling-out structure is arranged on a side of the substrate facing the organic layer stack. An optical supplementary layer is arranged between the substrate and the coupling-out structure. The optical supplementary layer has a refractive index that is less than the refractive index of the substrate, or the optical supplementary layer forms an angle-selective mirror that allows passage only of such light which is generated in the organic layer stack during operation and which can be coupled out from the substrate at an interface of the substrate facing away from the organic layer sequence.

By the optical supplementary layer, that proportion of radiation is minimized which impinges on the interface of the substrate facing away from the organic layer sequence at such a large angle that the proportion of radiation is subjected to total internal reflection there. At least part of the proportion of radiation is already reflected at the optical supplementary layer and can thereby be fed to the coupling-out structure again. As a result, the interaction of the light to be coupled out with the coupling-out structure increases overall. A further coupling-out structure on that side of the substrate which faces away from the organic layer sequence, for example, a structuring of the interface of the substrate, can be dispensed with. The interface of the substrate can be embodied in a planar fashion, for example, apart from production-dictated roughnesses. A complex structuring of the interface of the substrate, for example, for forming microlenses, can be dispensed with.

In accordance with at least one embodiment of the radiation-emitting component, the optical supplementary layer is in direct contact with the substrate. In other words, no further layer is arranged between the optical supplementary layer and the substrate.

In accordance with at least one embodiment of the radiation-emitting component, the first electrode layer is in direct contact with the optical supplementary layer and/or with the coupling-out structure. By way of example, the first electrode layer directly adjoins the optical supplementary layer on the side facing the substrate and the coupling-out structure on the side facing away from the substrate.

Alternatively, for example, the coupling-out structure is arranged between the first electrode layer and the optical supplementary layer. In this case, the first electrode layer directly adjoins only the coupling-out structure and not the optical supplementary layer.

In accordance with at least one embodiment of the radiation-emitting component, the refractive index of the optical supplementary layer is less than or equal to 1.49. Such an optical supplementary layer has, for example, a refractive index that is less than the refractive index of glass, which is typically 1.5 or more.

The lower the refractive index of the optical supplementary layer, the smaller that proportion of radiation which, although it passes through the optical supplementary layer, subsequently impinges on the interface of the substrate at an angle that is greater than the critical angle of total internal reflection and, therefore, cannot be coupled out from the substrate.

Preferably, the refractive index of the optical supplementary layer is between 1 and 1.4 inclusive.

A refractive index of 1 can be realized by an optical intermediate layer embodied as a vacuum gap. A refractive index of approximately 1 can be obtained with a gas, for example, air.

The ideal case of a refractive index of n=1 can be approximated by solid materials, in particular by materials having a porous structure.

In accordance with at least one embodiment of the radiation-emitting component, the refractive index of the optical supplementary layer is between 1.02 and 1.3 inclusive.

An optical supplementary layer having a refractive index in this range can be formed, for example, by a dielectric layer having a structure with cavities. By way of example, the optical supplementary layer can have a structure with so-called nanorods, cavities being formed between the nanorods. Such nanorods can be produced, for example, by deposition of the material for the optical supplementary layer at a large angle with respect to the normal, for example, an angle of 45° or more. The cavities can be filled with a gas, for example, air, or evacuated.

By way of example, an oxide, for instance titanium oxide or silicon oxide, is suitable as the dielectric layer.

In accordance with at least one embodiment of the radiation-emitting component, a maximum transmission angle of the angle-selective mirror relative to the normal to the optical supplementary layer is so small that the radiation passing through the optical supplementary layer is coupled into the substrate at a coupling-in angle that is less than or equal to the critical angle of total internal reflection at the interface of the substrate facing away from the organic layer sequence. The coupling-in angle is therefore that angle at which the radiation passes in the substrate. In case of doubt, the maximum transmission angle of the angle-selective mirror is that angle at which the angle-dependent reflectivity is half of the maximum reflectivity. By way of example, the maximum transmission angle is 40°.

Such an angle-selective mirror ensures that only radiation which, upon impinging on the interface of the substrate, is at least partly coupled out from the substrate through the interface can pass through the optical supplementary layer. By contrast, radiation which would be subjected to total internal reflection at the interface is already reflected at the optical supplementary layer and can thus be fed to the coupling-out structure again. The angle-selective mirror is formed, for example, by a plurality of dielectric layers of the optical supplementary layer. By a suitable choice of the number of layers, of the refractive indexes of the layers and the layer thickness thereof, such an angle-selective mirror can be realized in a simple and reliable manner.

In accordance with at least one embodiment of the radiation-emitting component, the coupling-out structure is formed by scattering locations. The scattering locations have a refractive index that is greater than or less than the refractive index of the material adjoining the scattering locations. By way of example, the difference between these refractive indexes is at least 0.05.

The scattering locations are formed, for example, in the organic layer stack and/or in a coupling-out layer arranged between the organic layer stack and the substrate. By way of example, the scattering locations are formed in the first transport layer and/or in the second transport layer. In this case, it is possible to dispense with a layer provided in addition to the transport layers for the coupling-out structure. Alternatively or supplementarily, a coupling-out layer provided separately with respect to the transport layers can be provided. Such a coupling-out layer is in particular also optimizable independently of its electrical conductivity for forming a coupling-out structure that is as efficient as possible.

In accordance with at least one embodiment of the radiation-emitting component, the coupling-out structure is formed by a lateral structuring of the organic layer stack. By way of example, the structuring is formed by at least one recess in the organic layer stack. The recess can extend in a vertical direction, that is to say in a direction running perpendicular to a main extension plane of the organic layer stack, completely or only regionally through the organic layer stack.

The at least one recess is filled by a filling material, for example, wherein the filling material has a higher refractive index or a lower refractive index than the material of the organic layer stack. Material of the organic layer stack typically has a refractive index of approximately 1.8. In case of doubt, the refractive index averaged over the individual layers of the organic layer stack can be used as the refractive index for the organic layer stack.

The difference in refractive index between the filling material and the material of the organic layer stack is preferably at least 0.05. Efficient deflection of radiation by the coupling-out structure is thus achievable in a simplified manner.

In a lateral direction, that is to say parallel to the main extension plane of the organic layer stack, the geometrical configuration of the structuring is variable within wide limits. By way of example, the structuring has a lattice-shaped structure.

In accordance with at least one embodiment of the radiation-emitting component, the organic layer stack is subdivided by the at least one recess into at least two partial regions separated laterally from one another. By way of example, partial regions arranged alongside one another in a matrixlike manner arise by a lattice-shaped structuring, wherein a respective trench-shaped recess runs between adjacent partial regions.

In a departure therefrom, however, the at least one recess can also be embodied in such a way that the organic layer stack forms a continuous area in a plan view of the radiation-emitting component.

The partial regions spaced apart laterally from one another can be electrically conductively connected to one another via the first electrode layer and furthermore also via the second electrode layer.

In accordance with at least one embodiment of the radiation-emitting component, the optical supplementary layer has a thickness of at least 0.2 μm, preferably of at least 0.5 μm. It has been found that an optical supplementary layer with this thickness can increase the coupling-out efficiency particularly effectively.

In accordance with at least one embodiment of the radiation-emitting component, the interface of the substrate facing away from the organic layer sequence is free of a coupling-out structure. In particular, the interface is free of a structuring introduced in a targeted manner.

It has been found that the radiation-emitting component, in particular on account of the coupling-out structure and the optical supplementary layer, can have such a high coupling-out efficiency that further coupling-out structures can be dispensed with.

In accordance with at least one embodiment of the radiation-emitting component, the substrate contains a glass or consists of glass. Such a substrate is distinguished by a high mechanical stability and optical transparency. In a departure therefrom, however, a flexible substrate, for example, a flexible plastics film, can also be employed.

BRIEF DESCRIPTION OF THE DRAWINGS

Further features, configurations and expediencies will become apparent from the following description of the exemplary embodiments in association with the figures.

In the figures:

FIGS. 1A and 1B show a first exemplary embodiment of a radiation-emitting component in schematic sectional view (FIG. 1A) and associated plan view (FIG. 1B);

Figure 2A:
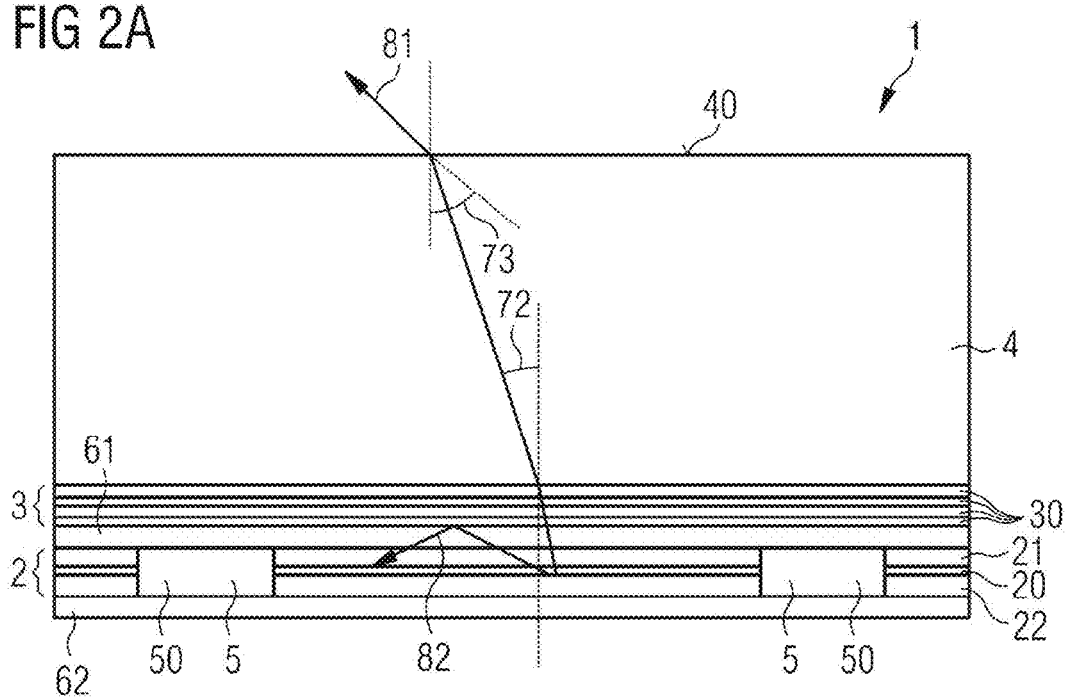
FIG. 2A shows a second exemplary embodiment of a radiation-emitting component in schematic sectional view.

Elements that are identical, of identical type or act identically are provided with identical reference signs in the figures.

The figures and the size relationships of the elements illustrated in the figures among one another should not be regarded as to scale. Rather, individual elements and in particular layer thicknesses may be illustrated with an exaggerated size in order to enable better illustration and/or in order to afford a better understanding.

DETAILED DESCRIPTION OF ILLUSTRATIVE EMBODIMENTS

A first exemplary embodiment of a radiation-emitting component is illustrated in schematic sectional view in FIG. 1A.

The radiation-emitting component 1 is embodied by way of example as an organic light emitting diode. The radiation-emitting component comprises an organic layer stack 2. The organic layer stack comprises an active region 20 arranged between a first transport layer 21 and a second transport layer 22. By way of example, the first transport layer 21 is embodied as a hole transport layer and the second transport layer 22 is embodied as an electron transport layer, or vice versa. By way of example, the materials indicated in the general part of the description are suitable for the organic layer stack, in particular for the active region 20.

The organic layer stack 2 is arranged on a substrate 4, for example, a glass substrate or a flexible substrate, for example, a flexible plastics film.

The organic layer stack 2 is arranged between a first electrode layer 61, for example, a cathode, and a second electrode layer 62, for example, an anode. These electrode layers are provided for injecting charge carriers into the active region. The electrode layers are accessible for external electrical contacting, for example, at a side region of the radiation-emitting component (not shown explicitly, in order to simplify the illustration).

An interface 40 of the substrate 4 facing away from the organic layer stack 2 forms a radiation exit surface for the radiation-emitting component 1. The first electrode layer 61 is expediently embodied such that it is transmissive to the radiation generated in the active region 20. By way of example, the first electrode layer 61 contains a TCO (transparent conductive oxide) material, for example, indium tin oxide (ITO).

The second electrode layer 62 can be embodied such that, for the radiation generated in the active region 20, it is radiation-transmissive for emission of radiation by the component 1 on both sides or it is reflective for the case of emission of radiation in only one direction.

The radiation-emitting component furthermore comprises a coupling-out structure 5. In the exemplary embodiment shown, the coupling-out structure is formed by a lateral structuring by recesses 50. In the exemplary embodiment shown, the recesses 50 extend completely through the organic layer stack 2. However, it is also conceivable for the recesses to extend in a vertical direction only partly through the organic layer stack. As illustrated in FIG. 1B, the structuring is formed by trench-shaped recesses in a plan view of the radiation-emitting component, wherein first trenches run parallel to one another along a first direction and second trenches run parallel to one another in a direction running perpendicular thereto, such that the organic layer stack 2 is subdivided into partial regions 25 arranged alongside one another in a matrix-shaped fashion. However, the geometrical arrangement of the recesses 50 is variable within wide limits. By way of example, the coupling-out structure 5 can be embodied such that the organic layer stack 2 is embodied in a continuous fashion in a plan view of the component.

In the exemplary embodiment shown, the partial regions 25 spaced apart laterally from one another are electrically conductively connected to one another via the first electrode layer 61 and the second electrode layer 62.

The recesses 50 are filled with a filling material having a lower refractive index or a higher refractive index than those of the organic layer stack 2. The radiation emitted in the active region 20 in a lateral direction can be deflected by the refractive index inhomogeneities thus occurring in a lateral direction.

An optical supplementary layer 3 is arranged between the substrate 4 and the organic layer stack 2. Furthermore, the optical supplementary layer 3 is in direct contact with the first electrode layer 61. The first electrode layer is furthermore in direct contact with the coupling-out structure 5.

The optical supplementary layer 3 has, for example, a thickness of between 0.2 µm and 10 µm inclusive, preferably between 0.5 µm and 5 µm inclusive.

In the exemplary embodiment shown, the optical supplementary layer 3 has a refractive index that is less than the refractive index of the substrate 4. By way of example, a glass substrate has a refractive index of 1.5. The refractive index of the optical supplementary layer is less than or equal to 1.49, preferably between 1 and 1.4 inclusive. A refractive index of 1 is achievable by an optical supplementary layer embodied as an evacuated interspace. In the case of an optical supplementary layer composed of solid matter, the refractive index of the optical supplementary layer can be approximated very near to the ideal value of a refractive index of 1. By way of example, the refractive index of the optical supplementary layer can be between 1.02 and 1.3 inclusive.

By way of example, a dielectric layer having cavities introduced in the layer is suitable for a refractive index in this range. By way of example, the optical supplementary layer can be a nanorod structure with cavities formed between the nanorods. By way of example, an oxide, for instance silicon oxide or titanium oxide, is suitable as dielectric material for the optical supplementary layer 3.

For the ideal case of a refractive index of n=1 for the optical supplementary layer 3, only that proportion of the radiation emitted in the active region 20 which can also be at least partly coupled out from the substrate at the interface 40 can pass through the optical supplementary layer. By contrast, proportions of radiation which impinge on the interface 40 at an angle with respect to the normal that is greater than the critical angle of total internal reflection cannot pass through the optical supplementary layer 3, but rather are already reflected at the optical supplementary layer 3 and can thus be fed to the coupling-out structure 5.

In the case of a glass substrate, the critical angle of total internal reflection, for example, with respect to air is approximately 41.8°.

As a result, overall the interaction between the radiation generated in the active region 20 and the coupling-out structure 5 is increased and the coupling-out efficiency from the radiation-emitting component is increased. An additional coupling-out structuring on the interface 40 is therefore not necessary and can be omitted in order to reduce the production costs. In principle, however, it is also conceivable for the interface to be provided with a further coupling-out structuring in order to increase the coupling-out efficiency even more extensively.

The second exemplary embodiment illustrated in FIG. 2A substantially corresponds to the first exemplary embodiment described in association with FIGS. 1A and 1B. In contrast thereto, an angle-selective mirror is formed by the optical supplementary layer 3. For this purpose, the optical supplementary layer 3 has a plurality of layers 30, wherein layers respectively adjoining one another have mutually different refractive indexes. By suitable setting of the parameters of the layers 30, in particular their layer thickness and their refractive index, and by the number of layers 30, a angle-selective mirror can be realized whose reflectivity for radiation that impinges on the optical supplementary layer at a small angle with respect to the normal is lower than for radiation which impinges on the optical supplementary layer 3 at a large angle with respect to the normal. A proportion of radiation which is emitted at a large angle with respect to the normal and is reflected at the optical supplementary layer 3 is illustrated by an arrow 82 in FIG. 2A. This proportion of radiation can be deflected after reflection at the coupling-out structure 5 and can subsequently emerge from the component 1.

Preferably, the optical supplementary layer allows passage only of radiation which can be coupled out at the interface 40. In particular, a coupling-in angle 72 at which the emitted radiation is coupled into the substrate 4 is less than the critical angle 73 of total internal reflection at the interface 40. This ensures that the only radiation which can impinge on the interface 40 is radiation which is at least partly coupled out at the interface and only a certain proportion of which is reflected back into the substrate at the interface.

The proportion of radiation which is coupled into the substrate at a coupling-in angle 72 that is less than the critical angle of total internal reflection 73 is illustrated with the aid of an arrow 81 in FIG. 2A.

In contrast to the first exemplary embodiment described in association with FIGS. 1A-1B, the refractive index of one or more of the layers 30 of the optical supplementary layer 3 can also be greater than or equal to the refractive index of the substrate 4.

Figure 2B:
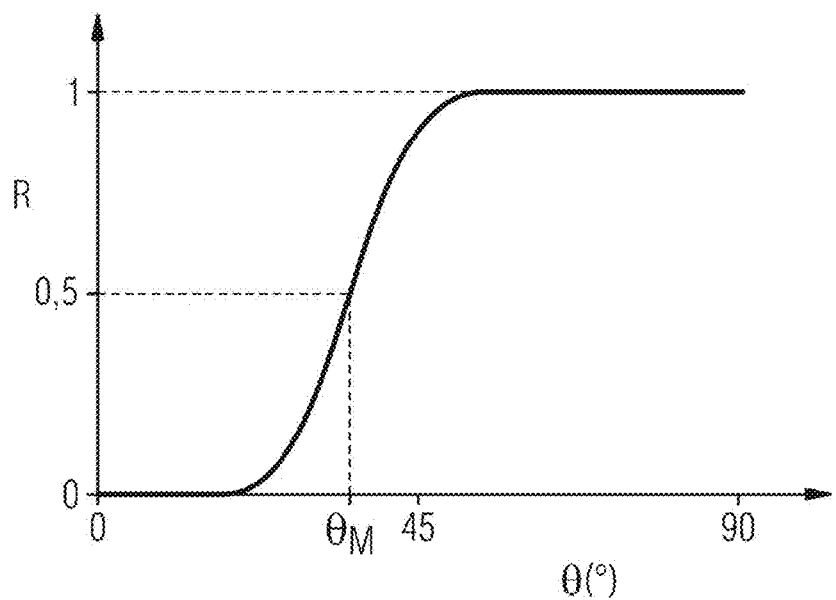
FIG. 2B shows one exemplary embodiment of a schematic profile of the reflectivity R of the angle-selective mirror as a function of the impingement angle θ.

One exemplary embodiment of the angle dependence of the reflectivity R of the optical supplementary layer is illustrated schematically in FIG. 2B. This shows for simplification the ideal case where the reflectivity of the angle-selective mirror is zero for perpendicularly impinging radiation, that is to say $\theta=0°$, and assumes a value of 1, that is to say 100%, for $\theta=90°$. It goes without saying that the reflectivity can also be greater than 0 for small angles and can also be less than 1 for large angles. Preferably, the reflectivity is at most 0.1 for $\theta=0°$. Furthermore, the reflectivity is preferably at least 0.8 for angles of $\theta \geq 50°$. Radiation passing at small angles with respect to the normal is therefore not prevented, or is prevented only insignificantly, from entering the substrate by the optical supplementary layer, while radiation at large angles with respect to the normal is efficiently reflected back.

In the exemplary embodiment shown, the angle-selective mirror has a maximum transmission angle $\theta_M$ of approximately 35°. As a result, radiation which would impinge on the interface 40 at a comparatively large angle, in particular an angle greater than the angle of total internal reflection, is already reflected at the optical supplementary layer and thus not coupled into the substrate 4. It goes without saying that the maximum transmission angle of the angle-selective mirror can also be greater than or less than 35°. Preferably, the maximum transmission angle is between 25° and 50° inclusive.

Figure 3:
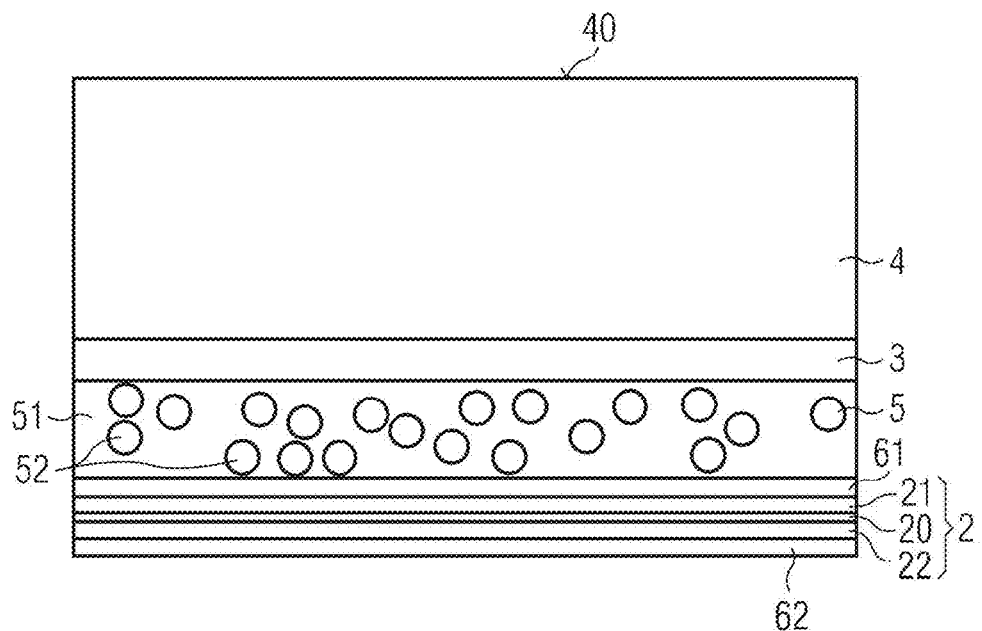
FIG. 3 shows a third exemplary embodiment of a radiation-emitting component in schematic sectional view.

The third exemplary embodiment illustrated in FIG. 3 substantially corresponds to the first exemplary embodiment described in association with FIGS. 1A-1B. In contrast thereto, the coupling-out structure 5 is formed by scattering locations 52. In this exemplary embodiment, the scattering locations 52 are arranged in a coupling-out layer 51. The coupling-out layer 51 is arranged outside the electrically conductive material arranged between the first electrode layer 61 and the second electrode layer 62 and can therefore also be embodied in an electrically insulating fashion. A lateral structuring of the organic layer for forming a coupling-out structure can be dispensed with in this case. However, such a structuring can additionally be provided as well.

Furthermore, the scattering locations 52 can also be arranged within the organic layer stack, for example, in the first transport layer 21 or in the second transport layer 22 or in the first electrode layer 61. An additional coupling-out layer is not absolutely necessary in this case, but can supplementarily be provided. It goes without saying that the described configuration of the coupling-out structure by scattering locations is also suitable for the second exemplary embodiment described in association with FIG. 2A.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A radiation-emitting component comprising:
   an organic layer stack arranged at a side of a substrate between a first electrode layer and a second electrode layer, the organic layer stack having an active region configured to generate radiation;
   a coupling-out structure arranged at the side of the substrate where the organic layer stack is arranged, the coupling-out structure configured to deflect the radiation based on scattering; and
   an optical supplementary layer arranged between the substrate and the first electrode layer,
   wherein the first electrode layer is arranged at the side of the substrate facing the organic layer stack,
   wherein the optical supplementary layer forms an angle-selective mirror that allows passage only of the radiation and of which a portion is coupled out from the substrate at an interface of the substrate at a side facing away from the organic layer stack,
   wherein a plurality of dielectric layers of the optical supplementary layer form the angle selective mirror,
   wherein the angle-selective mirror has a maximum transmission angle relative to a normal to the optical supplementary layer between 25° and 50° inclusive so that the maximum transmission angle is so small that the radiation passing through the optical supplementary layer is coupled into the substrate at a coupling-in angle that is less than a critical angle of total internal reflection at the interface of the substrate at the side facing away from the organic layer stack,
   wherein the coupling-out structure comprises a lateral structuring of the organic layer stack, wherein the lateral structuring comprises recesses extending completely though the organic layer stack, and
   wherein the organic layer stack is subdivided by the recesses into partial regions separated laterally from one another and are electrically conductively connected to one another via the first electrode layer and the second electrode layer.

2. The radiation-emitting component according to claim 1, wherein the optical supplementary layer is in direct contact with the substrate.

3. The radiation-emitting component according to claim 1, wherein the first electrode layer, which is arranged on the side of the organic layer stack facing the substrate, is in direct contact with the optical supplementary layer and/or with the coupling-out structure.

4. The radiation-emitting component according to claim 1, wherein a refractive index of the optical supplementary layer is less than or equal to 1.49.

5. The radiation-emitting component according to claim 1, wherein a refractive index of the optical supplementary layer is between 1 and 1.4 inclusive.

6. The radiation-emitting component according to claim 1, wherein a refractive index of the optical supplementary layer is between 1.02 and 1.3 inclusive.

7. The radiation-emitting component according to claim 1, wherein the optical supplementary layer has a thickness of at least 0.5 µm.

8. The radiation-emitting component according to claim 1, wherein the interface of the substrate facing away from the organic layer stack is free of a coupling-out structure.

9. The radiation-emitting component according to claim 1, wherein the substrate contains glass.

* * * * *

UNITED STATES PATENT AND TRADEMARK OFFICE
CERTIFICATE OF CORRECTION

PATENT NO. : 10,263,219 B2
APPLICATION NO. : 14/917048
DATED : April 16, 2019
INVENTOR(S) : Wiesmann et al.

Page 1 of 1

It is certified that error appears in the above-identified patent and that said Letters Patent is hereby corrected as shown below:

On the Title Page

Item (86), Line 1, delete "PCT/EP2014/006823" and insert --PCT/EP2014/068263--.

Signed and Sealed this
Second Day of July, 2019

Andrei Iancu
*Director of the United States Patent and Trademark Office*